United States Patent [19]
Naito

[11] 4,222,005
[45] Sep. 9, 1980

[54] TESTING DEVICE FOR GENERATOR OUTPUT VOLTAGE REGULATORS

[75] Inventor: Shotaro Naito, Katsuta, Japan
[73] Assignee: Hitachi, Ltd., Japan
[21] Appl. No.: 887,366
[22] Filed: Mar. 16, 1978
[30] Foreign Application Priority Data
  Mar. 22, 1977 [JP] Japan ............................ 52-30369
[51] Int. Cl.$^2$ .............................................. G01R 31/02
[52] U.S. Cl. ......................... 324/158 MG; 324/158 R; 324/416
[58] Field of Search ......... 324/158 MG, 158 R, 73 R, 324/28 R, 15, 416; 322/99

[56] References Cited
U.S. PATENT DOCUMENTS 3,947,757  3/1976  Grube et al. ................... 324/158 R Primary Examiner—Ernest F. Karlsen
Attorney, Agent, or Firm—Craig and Antonelli

[57] ABSTRACT

There is disclosed a testing device for a voltage regulator incorporated in a generator assembly for controlling the output voltage of the generator assembly to a predetermined value, the generator assembly including an AC generator having a field coil and an armature coil, and a rectifier for rectifying the output of the AC generator. The testing device comprises a DC power source, a variable voltage generator for supplying a variable voltage to the input of the voltage regulator, and a resistor connected between the DC power source and the field coil, whereby presence or absence of failures of the voltage regulator may be judged from a magnitude of the input variable voltage and a change in voltage at a junction between the field coil and the resistor, as the input voltage is gradually increased.

9 Claims, 4 Drawing Figures

TESTING DEVICE FOR GENERATOR OUTPUT VOLTAGE REGULATORS

LIST OF PRIOR ART REFERENCES (37 CFR 1.56 (a))

The following reference is cited to show the state of the art: Japanese Utility Model Application Laid-Open No. 58211/'75

BACKGROUND OF THE INVENTION

This invention relates to a testing device for semiconductor voltage regulators, and more particularly to a testing device suitable for testing such a semiconductor voltage regulator as is incorporated in a generator assembly having an AC generator.

Conventionally, it was the practice to conduct a test for checking failures of a semiconductor voltage regulator incorporated in a generator assembly including an AC generator by rotating the AC generator or disconnecting the regulator from the generator assembly. This conventional testing method, however, it disadvantageous in that a device for rotating the AC generator is needed or it takes a long time to conduct the test. Therefore, there is a demand for a testing device with which the test can easily be effected without taking the incorporated regulator out of the generator assembly.

SUMMARY OF THE INVENTION

Therefore, an object of the present invention is to provide a testing device for a semiconductor voltage regulator incorporated in a generator assembly having an AC generator, with which a test for checking failures of the semiconductor voltage regulator can easily be conducted without taking the regulator out of the generator assembly and without rotating the AC generator.

To accomplish this and other objects a DC power source is coupled to means for applying a variable voltage to the input of the regulator, and a resistor is connected between the DC power source and the field coil of the AC generator to conduct a voltage from the DC power source to the field coil with a predetermined voltage drop. The input voltage to the voltage regulator is gradually increased, so that the presence or absence of failures of the regulator may be judged from a magnitude of the input voltage and a change in voltage at a junction between the field coil and the resistor.

DESCRIPTION OF THE PREFERRED EMBODIMENTS

Figure 1:
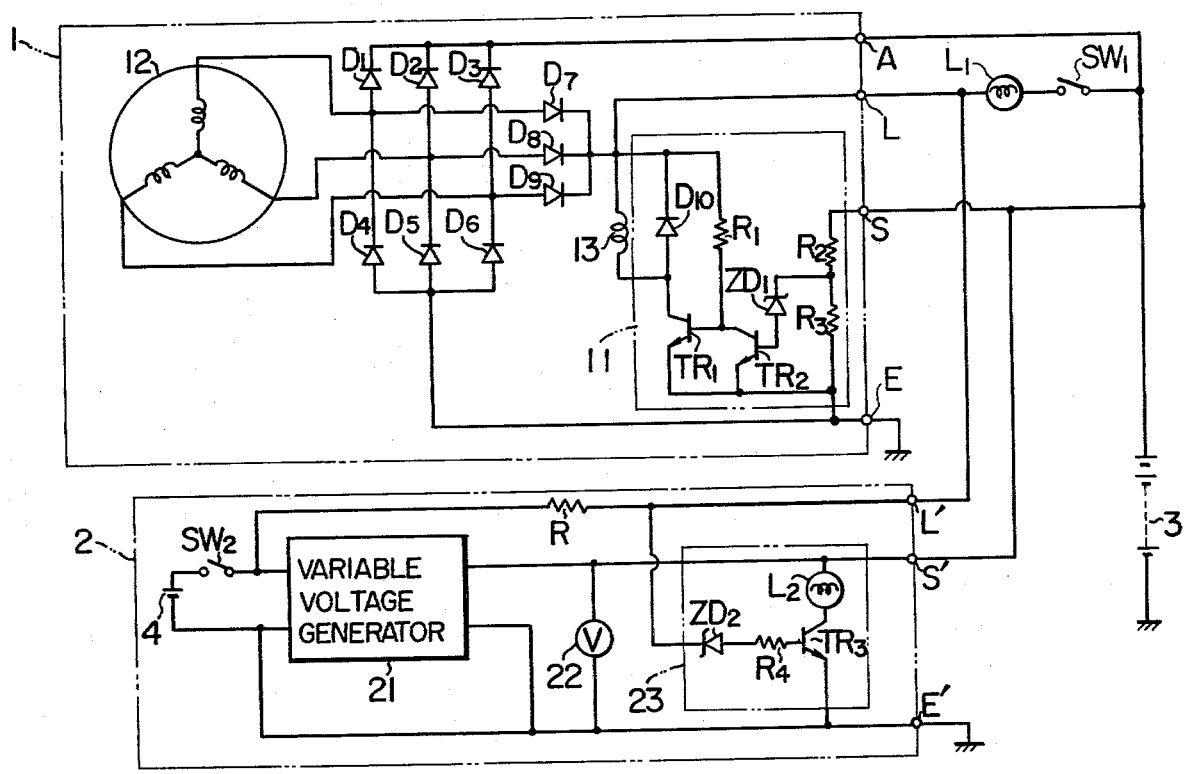
FIG. 1 is a circuit diagram showing an embodiment of the invention.

Referring now to FIG. 1 showing an embodiment of the invention, a generator assembly 1 comprises a semiconductor voltage regulator 11 incorporated in the assembly, an AC generator with an armature 12 and a field coil 13, three-phase rectifier diodes $D_1$ to $D_6$, and auxiliary rectifier diodes $D_7$ to $D_9$.

The generator assembly, which is carried on an automobile, for example, is adapted to generate a DC voltage to charge a battery 3 carried on the vehicle. When a key switch $SW_1$ is thrown on, a base current is fed from the battery 3 through a terminal L and a resistor $R_1$ to a transistor $TR_1$, thereby turning on the transistor $TR_1$ and allowing a current to flow through the field coil 13. At the same time, a charging pilot lamp $L_1$ is turned on. As the number of revolutions of the armature 12 increases in synchronism with the rotation of the vehicle engine, an AC voltage is included in the armature coil 12. This AC voltage is, on the one hand, rectified through the diodes $D_1$ to $D_6$ in a full-wave rectification fashion into a DC voltage which in turn charges the battery 3 through a terminal A, and, on the other hand, rectified through the diodes $D_7$ to $D_9$ so as to increase the current flowing through the field coil 13. When the voltage of the battery 3 increases until it reaches the voltage at the terminal A, the charging pilot lamp $L_1$ is turned off.

At a voltage detecting terminal S, which is an input terminal of the voltage regulator 11, the voltage of the battery 3 is detected. When voltage of the battery 13 i.e., the output voltage of the generator assembly 1 exceeds a predetermined value, 00 and hence a division of the voltage of the battery 3 produced by a resistor divider consisting of resistors $R_2$ and $R_3$ exceeds a Zener voltage of a Zener diode $ZD_1$, the Zener diode $ZD_1$ and a transistor $TR_2$ are turned on and the transistor $TR_1$ is turned off. This decreases the current of field coil 13 to reduce the output voltage of the generator assembly. In this manner, controlling of output voltage is accomplished. A diode $D_{10}$ is a fly-wheel diode and a terminal E is grounded.

As described above, the generator assembly incorporating the semiconductor voltage regulator is provided with output terminals A and E, the initial exciting and charging pilot lamp terminal L and the voltage regulator input terminal S standing for the voltage detecting terminal. Terminals other than the above ones are normally dispensed with. The invention utilizes the terminals L, S and E to which a testing device is connected, so that a test for checking failures of the regulator 11 can easily be made without the necessity of rotating the armature 12.

A testing device 2 embodying the invention comprises a DC power source 4, a circuit 21 connected to the DC power source 4 to generate a variable voltage, a voltage detector 22 for indicating the output voltage of the variable voltage generator circuit 21, a resistor R connected between the field coil 13 and the DC power source 4 through the terminal L of the generator assembly 1 and a terminal L' of the testing device 2, and a voltage change detector circuit 23 for detecting a change in voltage at the junction between the field coil 13 and the resistor R, that is, at the terminal L. As the DC power source 4, the battery 3 may be used with a suitable booster. A terminal S' is connected to the terminal S of generator assembly 1 while a terminal E' is grounded.

When testing the regulator 11, a switch $SW_2$ is thrown on and a voltage adjuster 30 (FIG. 3) of the variable voltage generator circuit 21 is then adjusted so that the voltage applied to input terminal S of the regulator 11 is increased gradually. If the regulator 11 is normal, the transistor $TR_1$ is turned on because of the base current flowing through the resistor R, terminal L and resistor $R_1$ before the output voltage $V_O$ of the variable voltage generator circuit 21 reaches the aforementioned predetermined value i.e., an operation voltage $V_p$ of the regulator (about 13 to 16 volts). Accordingly, a voltage $V_L$ at terminal L can be expressed as, $$V_L = \frac{r}{R+r} \times V_i$$

where R represents the resistance of the resistor R, r the DC resistance of the field coil 13, and $V_i$ the voltage of the DC power source 4. Subsequently, in the case of the regulator 11 being normal, when the output voltage $V_O$ reaches the operation voltage $V_p$ of the regulator 11, the transistor $TR_1$ is turned off and the voltage $V_L$ at the terminal L is increased to substantially the same level as the voltage $V_i$ of the DC power supply 4 (the resistance of the resistor $R_1$ is far larger than that of the resistor R). The increase in voltage $V_L$ causes a Zener diode $ZD_2$ of the voltage change detector circuit 23 and a transistor $TR_3$ to turn on. This causes a lamp $L_2$ connected through the transistor $TR_3$ between the output terminals of the variable voltage generator circuit 21 to turn on, thereby indicating the normal state of the regulator 11.

Figure 2:
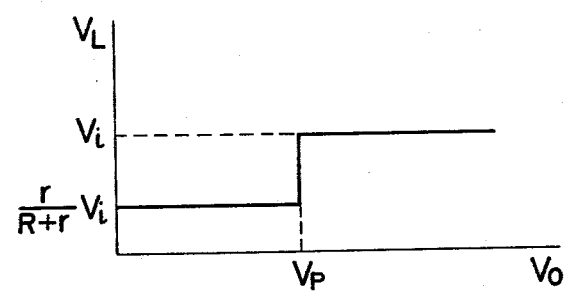
FIG. 2 is a graphic representation useful to explain judging failures from the change in voltage in the embodiment of FIG. 1.

FIG. 2 shows the change in voltage $V_L$ when the regulator 11 is normal. The operation voltage of the regulator 11 is set to 13 to 16 volts, for example, with a tolerance of about ±0.3 volts in consideration of the irregularity of the Zener diode $ZD_1$ and the other circuit elements. As one mode of failure of the regulator 11, it is assumed that the transistor $TR_1$ is accidentally turned off. In this case, even with a voltage $V_O$ of zero, the voltage $V_L$ is in the high level substantially equal to the voltage $V_i$. Therefore, as soon as the voltage $V_O$ increases up to a value sufficient to turn on the lamp $L_2$, this lamp $L_2$ lights. In another mode of failure, such that the transistor $TR_1$ is accidentally turned off before the voltage $V_O$ reaches the operation voltage $V_p$, the lamp $L_2$ is caused to turn on at a level of voltage $V_O$ lower than the range of the set operation voltage. In another mode of failure in which the transistor $TR_1$ remains turned on, the lamp $L_2$ will not turn on even when the voltage $V_O$ is increased to its maximum value. In still another mode of failure in which the transistor $TR_1$ is turned off when the voltage $V_O$ exceeds the operation voltage $V_p$, the lamp $L_2$ will turn on at a level of voltage $V_O$ higher than the range of the set operation voltage.

The voltage detector 22 serves to indicate a voltage at which the regulator 11 operates and a D.C. voltage meter may be used as the detector. The voltage change detector circuit 23 is described by way of example as being comprised of the Zener diode, transistor and lamp, but instead it may be formed by a comparator and a meter in combination, for example. Also, in place of the lamp, a buzzer may be used.

Testing accuracy depends on a ratio of the resistance R and the DC resistance r of the field coil 13. Assuming now that the maximum leakage current of transistor $TR_1$ is 1 mA and the voltage $V_i$ of the DC power source 4 is 13 volts, the resistance value between the terminal L and ground is 13K ohms with the transistor $TR_1$ turned off. This value is considered for determining the upper limit of the resistance R. The testing device of this embodiment detects the change in voltage $V_L$ at the terminal L by means of the detector circuit 23. Accordingly, it suffices that a change in voltage is obtained at the terminal L such as to either cause or not cause the avalanche breakdown of the Zener diode $ZD_2$. About 1 volt may be sufficient for such a change in voltage. This means that a necessary voltage drop across the resistor R is about 1 volt. The field coil 13 usually has a resistance, as its internal resistance, of several ohms, which is about 4 ohms, for example, so that the resistance R necessary for causing a voltage drop of 1 volt thereacross is:

$$R = 4(\Omega) \times \frac{1(V)}{13(V) - 1(V)} = 0.33 \ (\Omega).$$

However, if this resistance is too small, loss in the resistor R becomes unnecessarily large. Practically, power consumption in the resistor R is preferably less than 2 watts. In consideration of this condition and the aforementioned upper limit of resistance, the resistance value of the resistor R is preferably 150 $\Omega$ to 300 $\Omega$.

Figure 3:
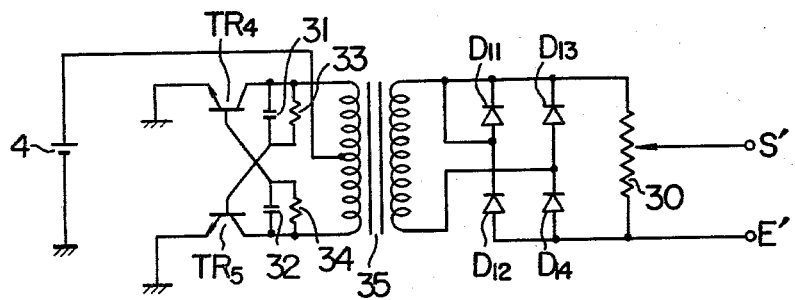
FIG. 3 is a circuit diagram of an example of variable voltage generator circuit used in the embodiment of FIG. 1.

The variable voltage generator circuit 21, as shown in FIG. 3, is adapted to produce a DC voltage of up to about 16 volts from the DC power source 4 (6 to 12 volts) and constituted by a so-called DC-DC converter. The voltage adjuster 30 for producing the variable voltage is simply shown as a variable resistor, but, instead may be constituted by a semiconductor circuit which changes the output voltage.

A multivibrator comprised of transistors $TR_4$ and $TR_5$, resistors 33 and 34, and a transformer 35 drives divided coils of the primary winding of the transformer 35 alternately so as to generate an AC voltage across the secondary winding of transformer 35 in accordance with the winding ratio. Capacitors 31 and 32 are effective to improve and stabilize oscillating waveforms, and the resistors 33 and 34 determine optimum currents of the transistors $TR_4$ and $TR_5$. The AC voltage developing across the secondary winding is rectified into a DC voltage through a rectifier circuit of diodes $D_{11}$ to $D_{14}$. The DC voltage is gradually increased and delivered, through the variable resistor 30, and applied to the voltage detector 22, the voltage change detector circuit 23, and the input terminal S of the regulator 11.

Figure 4:
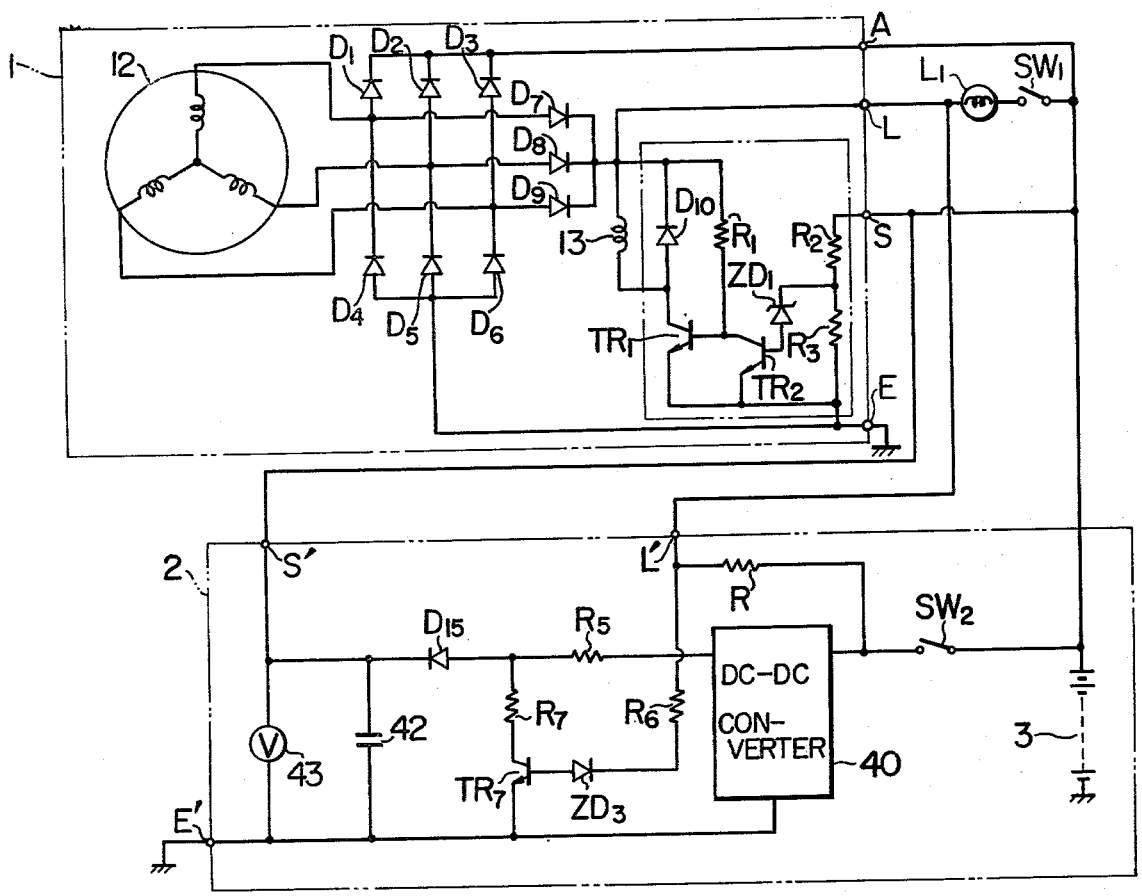
FIG. 4 is a circuit diagram showing another embodiment of the invention.

Another embodiment of the invention will be described with reference to FIG. 4, in which the same members as those in FIG. 1 are designated by the same reference numerals or symbols. In this embodiment, the battery 3 carried on a vehicle is used as the DC power source for the testing device 2. A DC-DC converter 40 is connected to the battery 3 through the switch $SW_2$. The output voltage of the DC-DC converter 40 is set to be 1.5 to 2 times the operation voltage (set voltage) of the regulator 11. To the output terminal of the DC-DC converter 40, a transistor $TR_7$ is connected through resistors $R_5$ and $R_7$, a capacitor 42 and a voltage detector 43 in the form of a voltmeter are connected through the resistor $R_5$ and a diode $D_{15}$. The output terminal of the DC-DC converter is also connected to the input terminal S of the regulator 11 through the resistor $R_5$ and the diode $D_{15}$. The resistor R, similarly to the embodiment of FIG. 1, is connected between the DC power source 3 and the terminal L through the switch $SW_2$. Between the junction of the resistor R and the field coil 13 i.e., the terminal L and the base of transistor $TR_7$, a Zener diode $ZD_3$ is connected through a resistor $R_6$.

When the switch $SW_2$ is thrown on for checking failures of the regulator 11, the voltage $V_L$ at the terminal L assumes the value of $r/(R+r) \times V_i$, as described above. If this voltage value is set lower than the Zener voltage of the Zener diode $ZD_3$ by determining the resistance value of the resistor R in the same manner as above, the transistor $TR_7$ is rendered off. As a result, the capacitor 42 is charged with the output voltage of the DC-DC converter 40 and the voltage at the terminal S' is gradually increased. When the voltage at the terminal S reaches the operation voltage of the regulator 11, the voltage $V_L$ is increased and becomes approximately equal to the voltage $V_i$ of the battery 3 as in the first embodiment so that the Zener diode $ZD_3$ and transistor $TR_7$ are both turned on, thereby to cease charging of the capacitor 42. Thus, charge stored in the capacitor 42 is discharged through resistors $R_2$ and $R_3$ and the voltmeter 43. When the voltage at the terminal S falls below the operation voltage of the regulator, the above operation is repeated. Accordingly, the voltmeter 43 indicates the operation voltage of the regulator 11.

In one mode of failure of the regulator 11 in which the transistor $TR_1$ remains turned on, the transistor $TR_7$ will remain turned off with the result that the voltmeter 43 indicates a voltage which is approximately equal to the output voltage of the DC-DC converter 40. In another mode of failure in which the transistor $TR_1$ remains turned off, the transistor $TR_7$ will remain turned on and hence the voltmeter 43 indicates a voltage which is a division of the DC-DC converter output voltage produced by a resistor divider consisting of the resistors $R_5$ and $R_7$. As will be seen from the above, in the other mode of the failure, the voltmeter 43 indicates a voltage other than the operation voltage of the regulator 11.

I claim:

1. A testing device for a semiconductor voltage regulator incorporated in a generator assembly including an AC generator having a field coil and an armature coil, rectifier means for rectifying a voltage induced in the armature coil, and means coupled to the field coil to supply a field current to said field coil, said regulator having a voltage detecting terminal coupled to said rectifier means for detecting an output voltage of the generator assembly, and a reference terminal, wherein said regulator is also coupled to said field coil and adjusts the current flowing through the field coil in accordance with the level of said output voltage of said generator assembly sensed at said voltage detecting terminal to control said output voltage to a predetermined value, wherein said testing device comprises a DC power source, first means connected to said DC power source for supplying a variable voltage across the voltage detecting terminal and the reference terminal of said regulator, second means including a resistor and said DC power source connected in series between said field coil and said reference terminal, means for detecting the varying output voltage of said first means, and means for detecting a change in voltage between a junction between said field coil and said resistor and said reference terminal thereby enabling said testing device to test the regulator while said regulator is coupled to said field coil and said rectifier means.

2. A testing device according to claim 1, wherein said generator assembly further comprises an output terminal for coupling said generator assembly to a battery for charging the battery, and an initial exciting terminal for feeding an initial exciting current to said field coil from said battery, and said resistor is connected to said field coil through said initial exciting terminal.

3. A testing device according to claim 2, wherein said DC power source comprises said battery.

4. A testing device according to claim 1, 2, or 3, wherein said voltage change detecting means comprises a transistor connected to an output terminal of said first means, and a Zener diode connected between the base of said transistor and said junction.

5. A testing device according to claim 4, wherein said voltage change detecting means comprises a lamp connected to the collector of said transistor.

6. A testing device according to claim 3, wherein said first means comprises a DC-DC converter for boosting the voltage of said DC power source, and a capacitor to be charged with the output voltage of said DC-DC converter.

7. A testing device according to claim 6, wherein said variable voltage detecting means comprises a voltage indicator connected in parallel with said capacitor for indicating a voltage across said capacitor, and said voltage change detecting means comprises a transistor connected in parallel with said capacitor, a Zener diode connected between the base of said transistor and said junction, and said voltage indicator.

8. A testing device for a semiconductor voltage regulator incorporated in a generator assembly including an AC generator having a field coil and an armature coil, rectifier means for rectifying a voltage induced in the armature coil, an output terminal connected to said rectifier means, an initial exciting terminal connected to one end of said field coil and to means for supplying an initial exciting current to said field coil, auxiliary rectifier means connected to said one end of the field coil for rectifying a voltage induced in the armature coil and supplying a field current to said field coil, said regulator having a voltage detecting terminal connected to said output terminal for detecting an output voltage of said generator assembly and a semiconductor switching device connected to the other end of said field coil, said regulator having a reference terminal, the operation of said switching device being controlled by the detected output voltage at said voltage detecting terminal for adjusting a current flowing through said field coil in accordance with the level of said output voltage to a predetermined value, wherein said testing device comprises a DC power source, first means connected to said DC power source for supplying a a variable voltage across the voltage detecting terminal and the reference terminal of said regulator, second means including a series resistor connected to said DC power source for supplying a voltage across said initial exciting terminal and said reference terminal, means for detecting the varying output voltage of said first means, and means for detecting a change in voltage between a junction between said initial exciting terminal and said resistor and said reference terminal thereby enabling said testing device to test the regulator while said regulator is coupled to said field coil and said rectifier.

9. A testing device according to claim 8, wherein said generator assembly further comprises an output terminal for charging a battery, and said DC power source comprises said battery.

* * * * *